United States Patent [19]
Holden et al.

[11] Patent Number: 6,046,435
[45] Date of Patent: Apr. 4, 2000

[54] METHOD OF HEATING A SUBSTRATE WITH MULTIPLE SELECTIVELY DEACTUATED HEATERS

[75] Inventors: Scott C. Holden, Melrose; Mehran Asdigha, Brighton; Lawrence R. Moschini, Carlisle; Darius Dilmaghani, Worcester; Mario Valenza, Medford, all of Mass.

[73] Assignee: Brooks Automation, Inc., Chelmsford, Mass.

[21] Appl. No.: 09/274,067

[22] Filed: Mar. 22, 1999

Related U.S. Application Data

[62] Division of application No. 08/882,367, Jun. 25, 1997.

[51] Int. Cl.[7] .................................................. F27B 5/14
[52] U.S. Cl. ......................... 219/390; 219/405; 219/411; 118/724; 118/725
[58] Field of Search ................................ 219/390, 405, 219/411, 543, 544; 118/724, 725, 50.1; 392/435, 432, 438, 439

[56] References Cited

U.S. PATENT DOCUMENTS

| | | | |
|---|---|---|---|
| 3,883,719 | 5/1975 | Hurko | 219/464 |
| 4,150,280 | 4/1979 | Hurko | 219/544 |
| 4,481,406 | 11/1984 | Muka | 219/411 |
| 4,518,848 | 5/1985 | Weber | 219/462 |
| 4,715,921 | 12/1987 | Maher et al. | 156/345 |
| 4,789,771 | 12/1988 | Robinson et al. | 219/405 |
| 4,903,754 | 2/1990 | Hirscher et al. | 165/1 |
| 4,919,614 | 4/1990 | Kitagawa et al. | 432/259 |
| 4,979,464 | 12/1990 | Kunze-Concewitz | 118/725 |
| 5,059,770 | 10/1991 | Mahawili | 219/390 |
| 5,157,240 | 10/1992 | Chow | 219/457 |
| 5,411,076 | 5/1995 | Matsunaga et al. | 165/80.2 |
| 5,462,603 | 10/1995 | Murakami | 118/725 |
| 5,484,011 | 1/1996 | Tempman et al. | 165/1 |
| 5,536,918 | 7/1996 | Ohkase et al. | 219/390 |
| 5,588,827 | 12/1996 | Muka | 432/5 |
| 5,641,421 | 6/1997 | Manov et al. | 219/553 |
| 5,688,331 | 11/1997 | Aruga et al. | 118/725 |
| 5,693,244 | 12/1997 | Pragt et al. | 219/441 |
| 5,710,407 | 1/1998 | Moore et al. | 219/405 |
| 5,766,363 | 6/1998 | Mizuno et al. | 118/725 |
| 5,804,791 | 9/1998 | Gelus | 219/245 |

FOREIGN PATENT DOCUMENTS 1146280   6/1989   Japan .

Primary Examiner—Teresa Walberg
Assistant Examiner—Shawntina Fuqua
Attorney, Agent, or Firm—Perman & Green, LLP

[57] ABSTRACT

A substrate heating apparatus having a housing forming a substrate receiving chamber and a heater located inside the chamber. The heater has a thin film flat ribbon heater element sandwiched between two glass-ceramic panels.

21 Claims, 4 Drawing Sheets

METHOD OF HEATING A SUBSTRATE WITH MULTIPLE SELECTIVELY DEACTUATED HEATERS

This application is a divisional of copending application application Ser. No. 08/882,367 filed on Jun. 25, 1997.

BACKGROUND OF THE INVENTION

1. Field of The Invention

The present invention relates to a substrate heating apparatus and, more particularly, to a heater used in a substrate heating apparatus.

2. Prior Art

U.S. Pat. No. 4,903,754 discloses a heating plate with winding heating wires. U.S. Pat. No. 4,919,614 discloses a heater in a heat transmitting member. PCT patent publication No. WO 95/16800 discloses lamp heaters.

SUMMARY OF THE INVENTION

In accordance with one embodiment of the present invention, a substrate heating apparatus is provided comprising a housing and a heater. The housing forms a substrate receiving chamber. The heater is located inside the chamber. The heater comprises a heater element sandwiched between two glass-ceramic panels. The glass-ceramic panels may be supported by a metal frame. The top panel is preferably partially covered by a metal shield which holds stand-off supports for the substrate.

In accordance with another embodiment of the present invention a substrate heater is provided comprising a ceramic heat transfer element, a thin film ribbon heater element, and standoffs. The thin film ribbon heater element is attached directly to the ceramic heat transfer element. The standoffs are connected to the ceramic heat transfer element to support a substrate on the ceramic heat transfer element.

In accordance with another embodiment of the present invention, a substrate heating apparatus is provided comprising a housing, a top heater, and a bottom heater. The housing forms a substrate receiving chamber. The top heater is connected to the housing in the chamber. The bottom heater is connected to the housing in the chamber. The top heater is a different type of heater than the bottom heater in both construction and the deliverable quantity of heat possible. The substrate resides between the top and bottom heaters. Between the top heater and the substrate there is preferably a shutter mechanism that controls the amount of radiant heat transferred from the top heater to the substrate. The heater elements of the top heater are preferably of a coil design.

In accordance with one method of the present invention, a method of heating a substrate in a substrate heating apparatus is provided comprising steps of positioning the substrate in a chamber of the substrate heating apparatus below a top heater and above a bottom heater, the substrate being located on standoffs on the bottom heater; heating the substrate from heat generated by the top heater; and stopping the heating of the substrate from heat generated by the top heater and continuing heating of the substrate from heat generated by the bottom heater. This provides for rapid rise-time of the substrate and sustained temperature uniformity after achieving set point temperature

BRIEF DESCRIPTION OF THE DRAWINGS

The foregoing aspects and other features of the invention are explained in the following description, taken in connection with the accompanying drawings, wherein.

DETAILED DESCRIPTION OF THE PREFERRED EMBODIMENTS

Figure 1:
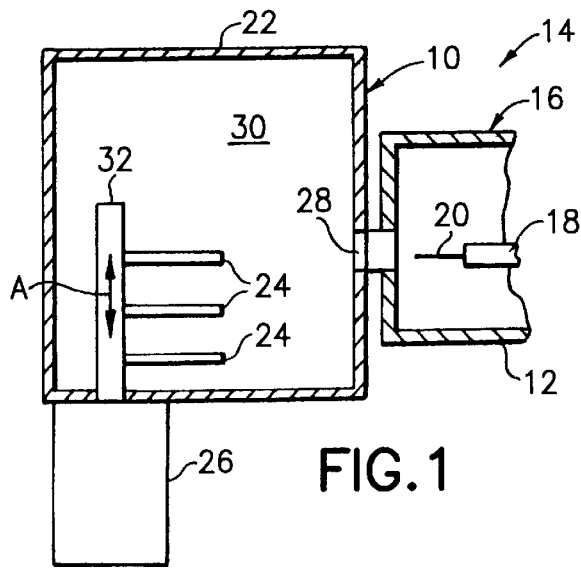
FIG. 1 is a schematic cross-sectional view of a substrate heating apparatus attached to a substrate transport chamber.

Referring to FIG. 1, there is shown a schematic cross-sectional view of a substrate heating apparatus 10 incorporating features of the present invention attached to a substrate transport chamber 12. Although the present invention will be described with reference to the embodiments shown in the drawings, it should be understood that the present invention could be embodied in many different alternate types of embodiments. In addition, any suitable size, shape or type of elements or materials could be used.

The substrate heating apparatus 10 is part of a substrate processing apparatus 14 which includes a transport 16 having the transport chamber 12 and a plurality of processing modules (not shown) attached to the transport chamber 12. An example of a substrate processing apparatus can be seen in U.S. Pat. No. 4,715,921 which is hereby incorporated by reference in its entirety. The substrate processing apparatus 14 is adapted to process substrates, such as semi-conductor wafers or panels for flat panel displays. The transport 16 includes a robot arm 18 with an end effector 20. The robot arm 18 is adapted to move substrates into and out of the processing modules and the heating apparatus 10. In alternate embodiments, any suitable type of substrate transport could be used and, the substrate heating apparatus 10 could be used in any suitable type of substrate processing apparatus.

The substrate heating apparatus 10 includes a housing 22, a plurality of heaters 24, and an elevator mechanism 26. The housing 22 is attached to the transport chamber 12 and has an entrance 28 into its chamber 30. Preferably, a door is located at the entrance 28 to seal off the chamber 30 from the transport chamber 12. The heaters 24 are located in the chamber 30 and are attached to an elevator arm 32 of the elevator mechanism 26 for movement up and down in the chamber 30 as illustrated by arrow A. In an alternate embodiment, the substrate heating apparatus could be a single substrate heater. In addition, the substrate heating apparatus need not have an elevator mechanism. The apparatus 10 is preferably used as a pre-heat and degas module.

Figure 2:
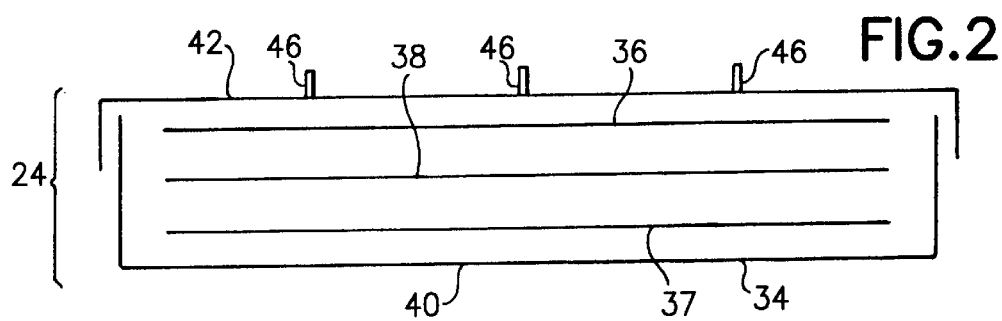
FIG. 2 is a schematic cross-sectional view of one of the heaters used in the substrate heating apparatus shown in FIG. 1.
Figure 3:
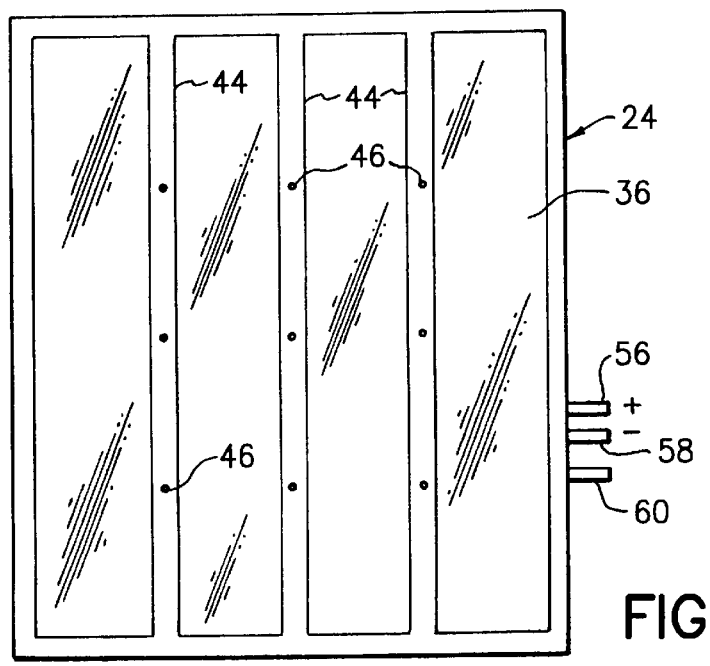
FIG. 3 is a top plan view of the heater shown in FIG. 2.

Referring also to FIG. 2, a schematic cross-sectional view of one of the heaters 24 is shown. In this embodiment the heater 24 includes a frame 34, two heat transfer members 36, 37, and a heater element 38. The frame 34 has a bottom member 40 and a top rim shield 42. Referring also to FIG. 3, the rim shield 42 has support webbing 44 with standoffs 46 thereon. The standoffs 46 are adapted to support the substrate on top of the heater 24. The majority of the rim shield 42 is open to allow radiant heat to travel directly from the top heat transfer member 36 upward towards the substrate on the standoffs 46. The rim shield 42 and bottom member 40 capture the other members therebetween. Preferably, the frame 34 is comprised of stainless steel. The bottom member 40 is preferably substantially open to allow heat to travel downward from the heater 24.

Figure 4:
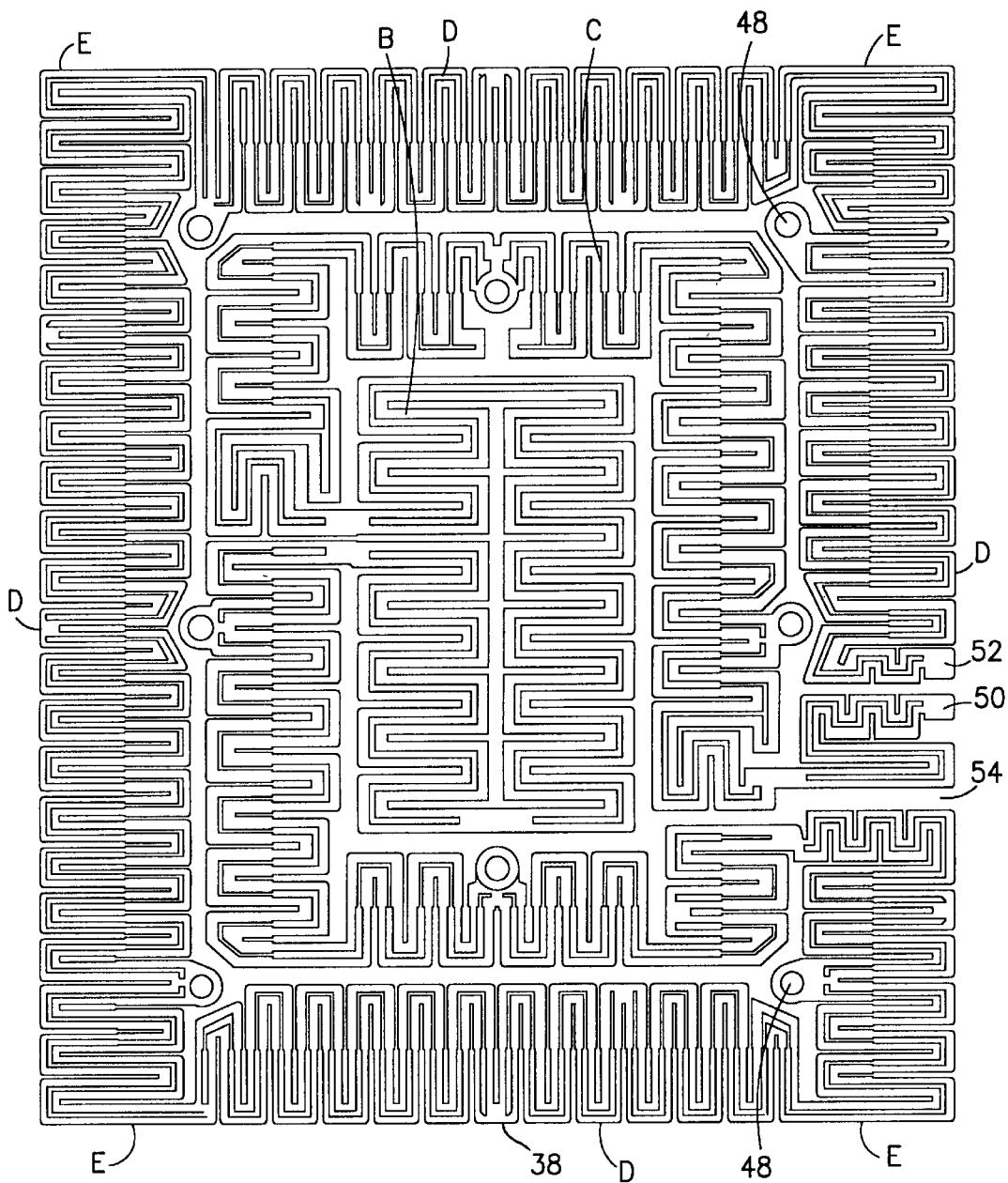
FIG. 4 is a top plan view of the thin film ribbon heater element used in the heater shown in FIG. 3.

The two heat transfer members 36, 37 have a general panel shape and are preferably comprised of ceramic. In particular, the members 36, 37 are preferably comprised of glass-ceramic material. Glass-ceramics are polycrystalline solids produced by the controlled crystallization of glasses. In a preferred embodiment the glass-ceramic panels are about 0.2 inch thick, but any suitable thickness could be used. In a preferred embodiment, the panels 36, 37 measure about 29 inches by 25 inches, but any suitable size could be provided. The glass-ceramic panels need not be rectangular. They could be circular or have any other suitable shape. The glass-ceramic material has been selected for the panels 36, 37 because, among other things, of its high radiation emissivity (about 0.8). It has also been discovered that the glass-ceramic material is particularly well suited for heaters of relatively large size substrates, such as more than 20 inches in width and/or length, because of the low thermal expansion of glass-ceramic material. Located between the two glass-ceramic panels 36, 37 is the heater element 38. Referring also to FIG. 4, the heater element 38, in the embodiment shown, is a thin film flat ribbon heater. The ribbon heater 38 is made of electrically conductive metal with a preferred thickness of about 0.004–0.005 inch. The pattern shown is formed by etching away unwanted metal from a flat thin sheet. The pattern includes securing holes 48, electrical contact mount areas 50, 52, a thermocouple clearance area 54, and a non-uniform pattern of serpentine looped sections. Two electrical contacts 56, 58 (see FIG. 3) are attached to the ribbon heater 38 at the electrical contact mount areas 50, 52 and extend out of the lateral side of the heater 24. A thermocouple 60 is located in the area 54 and also extends out of the lateral side of the heater 24. The rim shield 42 helps to protect the thermocouples from thermal cross-talk between any two adjacent heaters. The two glass-ceramic panels 36, 37 have recesses that physically locate and support the heater element and thermocouple.

Figure 4A:
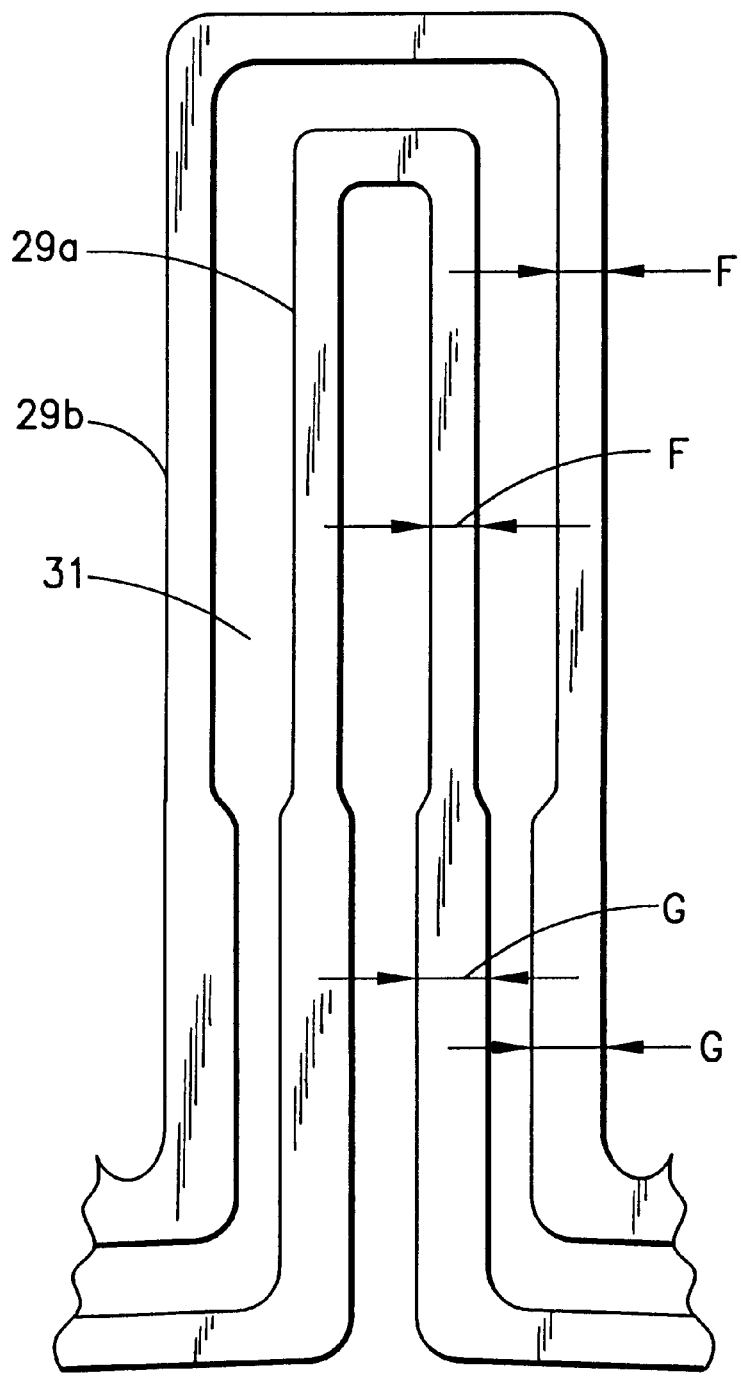
FIG. 4A is an enlarged view of one of the loops of the heater element shown in FIG. 4.

The pattern of the ribbon heater 38 has been designed to provide a substantially uniform heating of the substrate. The width of the metal in the strips that form the serpentine loops and the spacing between adjacent metal strips has been selected to provide different power density zones of heat generation. A center zone B has relatively wide strips and relatively wide spacing between adjacent strips. An intermediate zone C, which surrounds the center zone B, has varying strip width and spacing. The thinner the strip width the greater the electrical resistance. Thus, thinner strip width results in greater heat generation than wider strip width. The outer loop has side zones D and corner zones E. The corner zones E have the smallest width strips because heat loss will be greatest at the corners of the heater. Thus, the greatest heat generation is required at the corners in order to provide uniform heating of the substrate from the heater. Referring also to FIG. 4A, an enlarged view of one of the loops in one of the side zones D is shown. Most of the loops include a pair of loop strips 29a, 29b. A gap 31 separates the strips 29a, 29b. In zones C and D, the strips 29a, 29b have outer sections with thin strip widths F and inner sections with thicker strip widths G. Thus, in most of the loops in zones C and D, more heat is generated at the outer part of the loop (nearest to the perimeter edge of the element 38) than at the inner part of the loop. Thus, loops in the zone C have different inner and outer heat generation and loops in the zone D have different inner and outer heat generation. Other variations could be provided so long as the total heat output from the heater is a preferable uniform heating from the top surface of the plate 36 to the substrate. Uniform heating provides the advantage of reducing risk of non-uniform processing of the substrate after it leaves the heating chamber. This becomes increasingly important for large substrates, such as 20 inches or more in width and/or length, which will demand more from the heating system to provide uniformity. The unique shape of the pattern of the ribbon heater 38 allows the heating of substrates in vacuum or gas environments to temperatures of up to about 500° C. with very precise temperature uniformity. The heating allows impurities, such as water vapor, to be heated off of the substrate and removed by means of vacuum pumping in the degas process. In alternate embodiments, the pattern of the ribbon heater, including variations in conductor strip width and strip density, can be designed or varied based upon such variables as the shape of the substrate, the shape of the heater, and the expected or desired pattern of emission of heat from the heater to the substrate. In the present embodiment, the ribbon heater 38 was designed to heat a rectangular flat panel display substrate. Thus, heat generated from zone B needs to be less than heat generated from the other zones because less heat loss occurs in the center as compared to outer areas. The serpentine loops of the strips in all the zones B, C, D, E was selected to maximize strip density, but not make the strips so small as to inadvertently tear during assembly with the glass-ceramic panels 36, 37.

Figure 5:
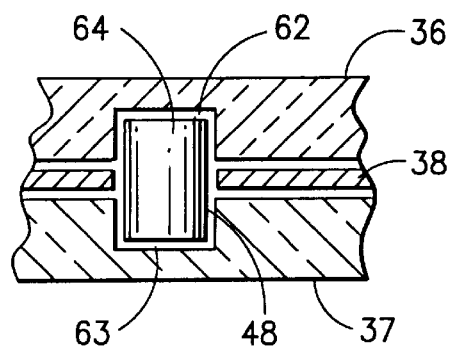
FIG. 5 is an enlarged cross-sectional view of a portion of the heater shown in FIG. 3.

Referring also to FIG. 5, a schematic cross-section of the panels 36, 37 and ribbon heater 38 is shown. The two panels 36, 37 sandwich the ribbon heater 38 therebetween. The panels 36, 37 have pin recesses 62, 63 that face each other. Mounting washer pins 64 are located in the recesses 62, 63 and in the mounting lugs 48 of the ribbon heater 38. These recesses and mounting lugs are strategically located across the heater to align the assembly and keep it assembled. In alternate embodiments, other types of means for aligning and retaining the assembly could be used.

Previous practice in the semiconductor industry has used either metal plate heaters or heating lamps to heat and degas substrates. In the case of a large flat panel display substrate, metal plate heaters were not practical because they were limited in the upper temperature achievable and, lamps were difficult to regulate for both set point temperature and substrate temperature uniformity. The heater described above provides for a tailored heat distribution across the top surface of the heater. In addition, the use of ceramic material provides high heat transfer rates when radiation is the only heat transfer medium possible, such as when the chamber 30 is maintained in a vacuum. Radiation emissivity can be as high as 0.8. This is about twice the emissivity one would expect in a metal plate heater. The location of the thermocouple directly between the plates 36, 37 can provide an accurate temperature measurement for controlling electrical power supply to the heater element 38. No adhesives or hardware are necessary to contain the heater element because the washing pins 64 lock the panel/heater element assembly together with the frame 34 completing the sandwich assembly. In alternate embodiments, the panels 36, 37 could be made of alternative materials such as other types of ceramics, glass and/or metal. If only top side heating from the heater is desired, the bottom member 40 of the frame 34 could be enclosed and insulated. The panels 36, 37 could also be made of dissimilar materials from each other. In other alternate embodiments, different types of heating elements could be used, such as a calrod. Because a calrod has its own electrical ceramic insulation, the calrod could be used directly on a metal heat transfer panel. However, the calrod needs to have a non-uniform serpentine pattern in order to provide a tailored substantially uniform heat distribution across the top surface of the heater. If the calrod is used with a glass-ceramic panel, the panel could have a calrod receiving groove along one of its sides to receive the calrod.

Figure 6:
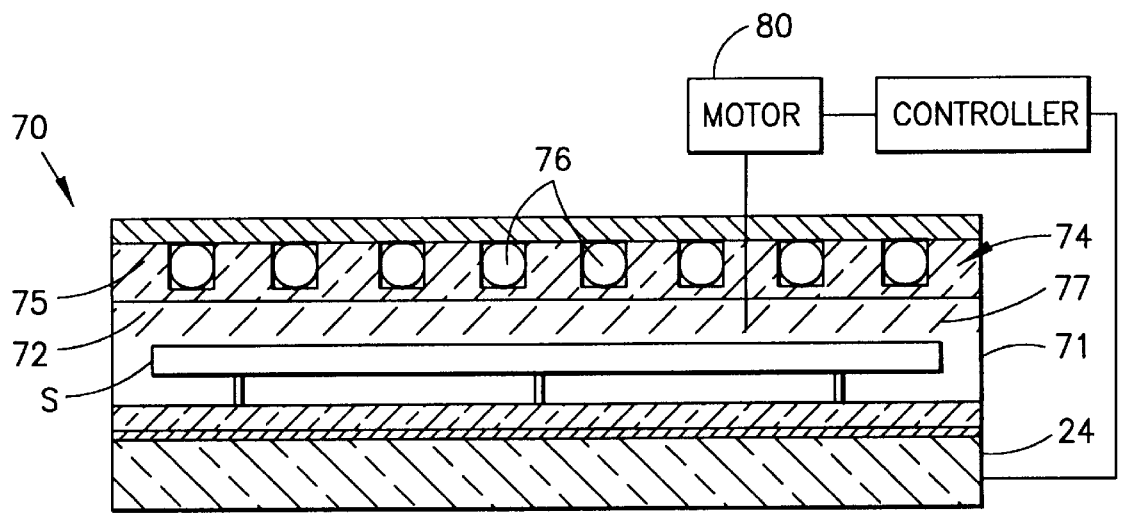
FIG. 6 is a schematic cross-sectional view of an alternate embodiment of a substrate heating apparatus.

Referring now to FIG. 6, an alternate embodiment is shown. In this embodiment a substrate heating apparatus 70 is provided with a housing 71 having a chamber 72, a top heater 74, and a bottom heater 24. The substrate S is positioned in the chamber 72 on the standoffs 46. More specifically, the substrate S is positioned below the top heater 74 and above the bottom heater 24. The top heater 74 is a different type of heater than the bottom heater 24. In this embodiment the top heater 74 comprises a ceramic plate 75 into which grooves are cut to provide a pattern for a wire coil type heating element 76. However, in alternate embodiments other types of heaters could be used. The apparatus 70 is specifically configured to provide a two step heating method. The top heater 74 is turned ON to provide a relatively quick temperature increase in the substrate. As the substrate quickly approaches its set point temperature, the top heater element is turned OFF and a set of vanes 77 of a shutter system is moved to a closed position. A motor 80 is connected to the vanes 77 to move the vanes between open and closed positions. However, any suitable type of drive system could be used. In addition, a shutter between the top heater and the substrate need not be provided. The vanes 77, in their closed position, block the top heater from the substrate. The bottom heater 24 is also turned ON. The bottom heater 24, which is designed to operate near the set point temperature can provide uniform heat transfer to the substrate S and continue to raise the temperature of the substrate S to its final desired temperature. This two step method provides the benefits of relatively fast speed heating from the top heater 74 and the controllability and uniformity of heat from the bottom heater 24 in the single apparatus 70. In an alternate embodiment, the heater 24 could be located on top of the substrate and a different type of heater could be located below the substrate. In another alternate embodiment, the apparatus could have two of the heaters 24; one above the substrate and one below the substrate. Other different types of heaters could also be used. Turning the top and bottom heaters ON and OFF and moving the vanes 77 between open and closed positions are preferably controlled by computer. The control may be based upon time that the top heater 74 is ON or a temperature sensor, as well as signals from the thermocouple in the bottom heater 24.

It should be understood that the foregoing description is only illustrative of the invention. Various alternatives and modifications can be devised by those skilled in the art without departing from the scope of the present invention. Accordingly, the present invention is intended to embrace all such alternatives, modifications and variances which fall within the scope of the appended claims.

What is claimed is:

1. A method of heating a substrate in a substrate heating apparatus, the method comprising steps of:
    positioning the substrate in a chamber of the substrate heating apparatus below a top heater and above a bottom heater, the substrate being located on standoffs on the bottom heater;
    heating the substrate from heat generated by the top heater; and
    stopping the heating of the substrate from heat generated by the top heater and continuing heating of the substrate from heat generated by the bottom heater.

2. A method as in claim 1 wherein the step of stopping comprises moving vanes located between the top heater and the substrate to a closed position.

3. A method as in claim 1 further comprising heating the substrate from heat generated by the bottom heater during heating of the substrate by the top heater.

4. A method as in claim 1 further comprising providing the top and bottom heaters as different types of heaters.

5. A method as in claim 1 wherein the step of stopping the heating of the substrate from heat generated by the top heater comprises reducing heat output from the top heater as the substrate approaches a final desired set point temperature.

6. A method as in claim 5 wherein the step of reducing heat output from the top heater comprises turning OFF a heater element in the top heater.

7. A method as in claim 5 wherein continuing heating of the substrate from heat generated by the bottom heater raises the temperature of the substrate to its final desired set point temperature.

8. A method as in claim 1 wherein continuing heating of the substrate from heat generated by the bottom heater comprises the bottom heater having a thin film ribbon heater element attached directly to a ceramic heat transfer element, and wherein the thin film ribbon heater generates heat which is transferred to the substrate through the ceramic heat transfer element.

9. A method as in claim 8 wherein the thin film ribbon heater element comprises serpentine looped sections arranged in a pattern of at least two concentric general ring sections with different thicknesses for generating different heat outputs from each general ring section.

10. A method as in claim 8 wherein the thin film ribbon heater element comprises loops having outer thin sections and inner thicker sections for generating different heat outputs from the different sections of each loop.

11. A method of heating a substrate in a substrate heating apparatus, the method comprising steps of:
    positioning the substrate in the substrate heating apparatus between a first heater and a second heater of the apparatus;
    heating the substrate from heat generated by the first heater; and
    reducing heat generated by the first heater and continuing heating of the substrate from heat generated by the second heater.

12. A method as in claim 11 further comprising heating the substrate from heat generated by the second heater during heating of the substrate by the first heater.

13. A method as in claim 11 further comprising providing first and second heaters as different types of heaters.

14. A method as in claim 11 wherein the step of stopping the heating of the substrate from heat generated by the first heater comprises reducing heat output from the first heater as the substrate approaches a final desired set point temperature.

15. A method as in claim 14 wherein the step of reducing heat output from the first heater comprises turning OFF a heater element in the first heater.

16. A method as in claim 14 wherein continuing heating of the substrate from heat generated by the second heater raises the temperature of the substrate to its set point temperature.

17. A method as in claim 11 wherein continuing heating of the substrate from heat generated by the second heater comprises the second heater having a thin film ribbon heater element attached directly to a ceramic heat transfer element, and wherein the thin film ribbon heater generates heat which is transferred to the substrate through the ceramic heat transfer element.

18. A method as in claim 17 wherein the thin film ribbon heater element comprises serpentine looped sections arranged in a pattern of at least two concentric general ring sections with different thicknesses for generating different heat outputs from each general ring section.

19. A method as in claim 17 wherein the thin film ribbon heater element comprises loops having outer thin sections and inner thicker sections for generating different heat outputs from the different sections of each loop.

20. A method of heating a substrate in a substrate heating apparatus, the method comprising steps of:

positioning the substrate in the substrate heating apparatus between a first heating and a second heater;

outputting heat from the first heater at a first rate to heat the substrate;

outputting heat from the second heater at a second rate to heat the substrate, wherein the first rate of heat output is larger than the second rate of heat output; and reducing heat output from the first heater as a temperature of the substrate approaches a desired final set point temperature and continuing heating of the substrate to the desired final set point temperature by the second heater.

21. A method as in claim 20 wherein the step of reducing heat output from the first heater comprises turning the first heater OFF.

* * * * *